US006380598B1

(12) United States Patent
Chan

(10) Patent No.: US 6,380,598 B1
(45) Date of Patent: *Apr. 30, 2002

(54) RADIATION HARDENED SEMICONDUCTOR MEMORY

(75) Inventor: Tsiu C. Chan, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/393,119

(22) Filed: Sep. 10, 1999

Related U.S. Application Data

(60) Continuation-in-part of application No. 09/209,654, filed on Dec. 10, 1998, now abandoned, which is a division of application No. 08/652,904, filed on May 23, 1996, now Pat. No. 5,849,614, which is a continuation of application No. 08/437,782, filed on May 9, 1995, now abandoned, which is a division of application No. 08/360,978, filed on Dec. 20, 1994, now abandoned.

(51) Int. Cl.[7] .................... H01L 31/062; H01L 31/113
(52) U.S. Cl. ................... 257/390; 257/394; 257/508
(58) Field of Search ................. 257/340, 351, 257/390, 488, 508, 547, 394; 365/54, 53, 51

(56) References Cited

U.S. PATENT DOCUMENTS

| 4,141,027 A | 2/1979 | Baldwin et al. ............... 357/51 |
| 4,262,298 A | 4/1981 | Tuan et al. .................... 357/41 |
| 4,513,304 A | 4/1985 | Takemae ................... 357/23.6 |

(List continued on next page.)

FOREIGN PATENT DOCUMENTS

| DE | 41 16 690 A1 | 11/1991 |
| EP | 0 150 993 A3 | 8/1985 |
| EP | 0 321 738 A3 | 6/1989 |
| EP | 0 361 121 A3 | 4/1990 |

OTHER PUBLICATIONS

Terman, "Aluminum–Silicon Self–Aligned Gate Process With Field Shield," *IBM Technical Disclosure Bulletin*, 15(9), 1973, pp. 2852–2854.

Krick, "Triple–Density MNOS Memory Array With Field Shield," *IBM Technical Disclosure Bulletin* 16(6), 1973, pp. 1723–1725.

Abbas et al., "Low–Leakage, N–Channel Silicon Gate FET With A Self–Aligned Field Shield," *IEDM Technical Digest*, IBM System Products Div., N.Y. 1973, pp. 371–373.

Terman et al., "Making A One–Device Memory Cell," *IBM Technical Disclosure Bulletin* 15(9), 1973, pp. 2852–2854.

Kalter and Vanderslice, Jr., "Making A One–Device Memory Cell," *IBM Technical Disclosure Bulletin* 18(4), Sep. 1975, pp. 1019–1020.

(List continued on next page.)

*Primary Examiner*—Olik Chaudhuri
*Assistant Examiner*—Hoai Pham
(74) *Attorney, Agent, or Firm*—David V. Carlson; Lisa K. Jorgenson

(57) ABSTRACT

A radiation hardened memory device having static random access memory cells includes active gate isolation structures to prevent leakage currents between active regions formed adjacent to each other on a substrate. The active gate isolation structure includes a gate oxide and polycrystalline silicon gate layer electrically coupled to a voltage terminal resulting in an active gate isolation structure that prevents a conductive channel extending from adjacent active regions from forming. The gate oxide of the active gate isolation structures is relatively thin compared to the conventional oxide isolation regions and thus, will be less susceptible to any adverse influence from trapped charges caused by radiation exposure.

21 Claims, 8 Drawing Sheets

| | | |
|---|---|---|
| 4,561,170 A | 12/1985 | Doering et al. ............... 29/571 |
| 4,570,331 A | 2/1986 | Eaton, Jr. et al. .......... 29/576 B |
| 4,853,894 A | 8/1989 | Yamanaka et al. .......... 365/154 |
| 4,900,693 A | 2/1990 | Manning ..................... 437/78 |
| 4,960,725 A | 10/1990 | Noguchi ...................... 437/57 |
| 4,994,893 A | 2/1991 | Ozaki et al. .................. 357/68 |
| 4,996,575 A | 2/1991 | Ipri et al. .................. 357/23.7 |
| 4,998,161 A | 3/1991 | Kimura et al. ............. 357/23.4 |
| 5,043,790 A | 8/1991 | Butler ......................... 357/68 |
| 5,067,000 A | 11/1991 | Eimori et al. ................. 357/53 |
| 5,104,822 A | 4/1992 | Butler ......................... 437/52 |
| 5,151,759 A | 9/1992 | Vinal ........................ 357/23.3 |
| 5,162,890 A | 11/1992 | Butler ........................ 257/306 |
| 5,164,803 A | 11/1992 | Ozaki et al. ................ 257/372 |
| 5,164,806 A | 11/1992 | Nagatomo et al. .......... 257/395 |
| 5,221,419 A | 6/1993 | Beckett ....................... 156/630 |
| 5,225,704 A | 7/1993 | Wakamiya et al. ......... 257/409 |
| 5,320,975 A | 6/1994 | Cederbaum et al. .......... 437/44 |
| 5,550,397 A | 8/1996 | Lifshitz et al. ............. 257/412 |
| 5,633,524 A | 5/1997 | Ueda et al. ................. 257/369 |
| 6,091,630 A | * 7/2000 | Chan et al. ................. 365/156 |

OTHER PUBLICATIONS

Dingwell et al., "A High Speed Bulk CMOS $C^2L$ Microprocessor," Microprocessor Advancements, in Proceedings of the IEEE International Solid State Circuits Conf., 1977, pp. 136–137.

Koyanagi et al., "Novel High Density, Stacked Capacitor MOS RAM," IEEE/IEDM, Washington, D.C., Dec. 4–6, 1978, pp. 348–351.

Wakamiya et al., "Fully Planarized $0.5\mu m$ Technologies for 16M DRAM," IEEE/IEDM, San Francisco, Dec. 11–14, 1988, pp. 246–249.

Shimizu et al., "Deep Submicron Device Isolation With Buried Insulator Between Source/Drain Polysilicon (BIPS)," IEEE/IEDM, San Francisco, Dec. 11–14, 1988, pp. 96–99.

"Selective Removal of Polysilicon to Obtain Improved Masterslice," *IBM Technical Disclosure Bulletin 31*(4), 1988, pp. 249–252.

Erb et al., "Hi–C Isolation of DRAM Storage Capacitors," IEEE/IEDM, San Francisco, Dec. 13–15, 1992, pp. 612–615.

Manchanda et al., "A High–Performance Directly Insertable Self–Aligned Ultra–Rad–Hard and Enhanced Isolation Field–Oxide Technology for Gigahertz Silicon," IEEE Transactions on Electron Devices 36(4):651–658, 1989.

Iwamatsu et al. "CAD–Compatible High–Speed CMOS/SIMOX Technology Using Field–Shield Isolation For 1M Gate Array," IEEE/IEDM, Washington, D.C., Dec. 5–8, 1993, pp. 475–478.

* cited by examiner

US 6,380,598 B1

RADIATION HARDENED SEMICONDUCTOR MEMORY

CROSS-REFERENCES TO PRIOR APPLICATIONS

This application is a continuation-in-part of U.S. patent application Ser. No. 09/209,654, filed Dec. 10, 1998, now abandoned, which is a divisional of U.S. patent application Ser. No. 08/652,904, filed May 23, 1996, and issued as U.S. Pat. No. 5,849,614, on Dec. 15, 1998, which is a continuation of U.S. patent application Ser. No. 08/437,782, filed on May 9, 1995, now abandoned, which is a divisional of U.S. patent application Ser. No. 08/360,978, filed Dec. 20, 1994, now abandoned.

TECHNICAL FIELD

The present invention relates generally to integrated electronic circuits and semiconductor memory devices, and more particularly, to using isolation of active regions in MOS integrated circuits to radiation harden semiconductor static random access memory cells.

BACKGROUND OF THE INVENTION

In today's metal-oxide semiconductor ("MOS") integrated circuit design, active regions on a chip are isolated from each other by a thick layer of thermally grown oxide, known as a field oxide, overlying doped channel-stop regions. This method of isolation has a number of disadvantages that become increasingly apparent with higher component density on the chip. The field oxide grows in areas not covered by a nitride mask layer used to define the active regions during processing. The use of a nitride mask forms a characteristic "bird's beak" shape in the oxide that consumes what would otherwise be usable active area while insignificantly contributing to the isolation function of the field oxide. The channel-stop dopants may also diffuse into the active area upon thermal growth of the field oxide, causing a narrow channel effect and increasing required threshold voltages for components constructed in the active regions. Further, mobile ions arising from electrical stress can cause shifts in the field threshold voltage, resulting in inconsistent performance of active circuit components.

In an isolation structure known as the "sea-of-gates," every other one of transistors has a grounded gate, thereby isolating those transistors without grounded gates on each of two opposite sides, while the traditional field oxide and channel stops are used to complete the isolation. However, all of the transistors in "sea-of-gate" design are of identical construction, and those with grounded gates are not therefore expressly designed or tailored for the isolation function they serve.

With increasing component density in today's integrated circuit design, it is highly desirable to provide effective isolation of active regions on a chip while minimizing the consumption of otherwise usable active area unnecessary to the isolation function.

In addition to the issues of integration density, conventional oxide isolation regions may be limited in their applicability in particular environments. For example, semiconductor memory devices used in outer space, such as in a satellite, are subjected to severe environmental conditions that may compromise the integrity of the stored data, or cause the memory devices to fail. In many cases, the memory devices are part of a larger embedded system, where the memory device is just one of many devices sharing the same die. The integrity of the memory devices used in outer space applications is critical because the information stored by the memory devices may be related to critical functions, such as guidance, positioning, and transmitting and receiving data from a ground base station. Furthermore, semiconductor memory devices for use in space applications should remain functional for the lifetime of the satellite, which may be as long as several years. Contrast this with applications where the memory devices are also subjected to harsh operating conditions, such as guidance systems in missiles, but only for a relatively short time period.

One cause of errors in semiconductor memory devices that are used in outer space applications is due to high-energy particles impinging on the memory device. There are several forms of high energy particles in outer space. For example, there are alpha particles and gamma rays, to name a couple. These high-energy particles strike the semiconductor material on which the memory devices are formed with enough energy to cause the generation of electron-hole pairs. The resulting charge carriers are often trapped in the various oxide layers of the memory devices. In the case of metal oxide semiconductor ("MOS") transistors, charges trapped in the gate oxide will shift the threshold voltage, Vt, of the transistor. As a result, leakage currents of the transistors, and consequently, of the memory devices may increase. Where the transistor is used as a transfer gate for a conventional memory cell, the increased leakage current may compromise the integrity of the data stored by the data storage node, such as a capacitor, by allowing the charge representing the data to dissipate.

The frequency or number of charges trapped in an oxide layer is proportional to the thickness of the oxide layer. Consequently, oxides having a greater thickness will, on the average, have a greater number of trapped charges. In the case where the oxide is relatively thick, for example, approximately 4000–5000 Å, charge trapped in the oxide will result in a much more dramatic shift in the leakage current characteristics than for an active transistor having a relatively thin gate oxide. Such an application of thick oxide is for isolating active transistor areas in which memory cells may be formed, for example, regions of local oxidation of silicon ("LOCOS"). The accumulating charge trapped in the LOCOS region may become great enough to cause a conduction channel to form below the LOCOS region, and consequently allow current to leak between neighboring active transistor regions.

As mentioned previously, transistors in the active region of a memory device, which typically have gate oxides that are much thinner than the oxides of the LOCOS region, will have shifting Vts as a result of the trapped charges in the gate oxide. A method that has been used to accommodate the shifting Vts is to raise the Vts of the active transistors so that the relative changes in the Vts due to the trapped charges are minor. Thus, the effect that trapped charges will have on the overall performance of the memory devices is minimized. However, the aforementioned technique is not as effective when applied to LOCOS isolation regions. Although the Vt of the incidental transistor of the LOCOS isolation regions may be adjusted so that the Vt shift due to charge trapped in the thick oxide is relatively small, the resulting isolation region will have an unacceptably low breakdown voltage.

Another technique used to accommodate charge trapped in a thick LOCOS isolation region is to create a two-layer oxide isolation structure. A relatively thin layer of oxide of approximately 500 Å is grown in the isolation region, followed by the formation of a relatively thick layer of phosphorous doped oxide of approximately 4000 Å over the relatively thin layer of oxide. The phosphorous doped oxide is subsequently densified by baking. The resulting structure minimizes the effect trapped positive charges have on the leakage characteristics of the isolation region by neutralizing the trapped positive charges with the abundance of electrons of the relatively thick phosphorous doped oxide. However, this approach is limited by the doping concentration of the relatively thick oxide layer. That is, the greater the level of impurities, the greater the diffusion of the impurities from the thick oxide into the adjacent layers.

Another approach taken in providing semiconductor memory devices suitable for use in space applications is through a method of trial and error. Samples of potentially applicable semiconductor memory devices are taken from several different process lots and subjected to severe radiation conditions that simulate the environment of outer space. The sample devices are subsequently tested for functionality and reliability. Those memory devices from the process lots having samples surviving the testing are judged to be acceptable for use in applications in outer space. However, this approach merely screens existing memory devices for those which may be sufficient for use in outer space applications, and consequently, the quantity of satisfactory memory devices produced by this method is subject to the unpredictable nature of semiconductor processing.

Therefore, there is a need for a semiconductor memory device having reliable data retention over a sufficiently long period of time for use in applications subjected to severe radiation environments, such as outer space.

SUMMARY OF THE INVENTION

According to the present invention, static random access memory ("SRAM") cells are formed having isolation gate structures constructed between or around active areas of a semiconductor substrate by forming an insulating layer on the surface of the substrate, forming a polycrystalline silicon layer on the insulating layer, and selectively etching away portions of the deposited layers to expose the active areas of the semiconductor substrate for further processing. Each of the memory cells has data storage nodes that are selectively coupled through transfer gates to a respective sense node. The data storage nodes are electrically isolated from each other, and the data storage nodes of adjacent memory cells by an active gate isolation structure that is formed in between the nodes and coupled to a voltage potential. The active gate isolation structure prevents a conductive channel extending between the data storage nodes of the memory cells from forming. The data storage nodes of the memory cells may be further isolated from one another by an oxide isolation structure formed in series with the active gate isolation structure and in between the data storage nodes.

DETAILED DESCRIPTION OF THE INVENTION

Figure 1:
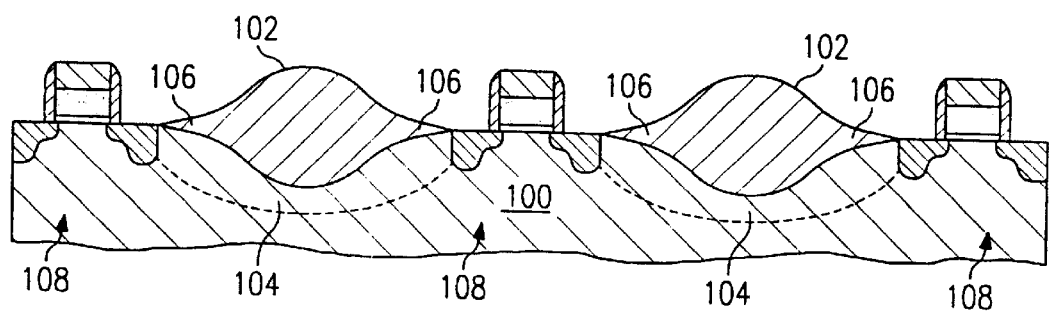
FIG. 1 is a cross-sectional view showing the prior art isolation of active areas by a thick layer of field oxide exhibiting the characteristic bird's beak.

FIG. 1 shows the NMOS prior art isolation of active areas 108 in a P-type substrate 100 by a thick layer of thermally grown field oxide 102. Below the field oxide 102 are channel-stop regions 104 formed by P-type implants which diffuse into the substrate 100 upon the thermal growth of the field oxide. The shape of the field oxide 102 exhibits the characteristic bird's beak feature 106 that arises from the field oxide penetrating beneath a silicon nitride layer used to define the active areas 108 on the chip during field oxide growth. One drawback of the current art method of forming the field oxide 102 is that if the active area 108 dimensions are too small, bird's beak encroachment can lift up and separate the silicon nitride layer from the underlying silicon, resulting in an even longer bird's beak structure or possible loss of all active area.

Figure 9:
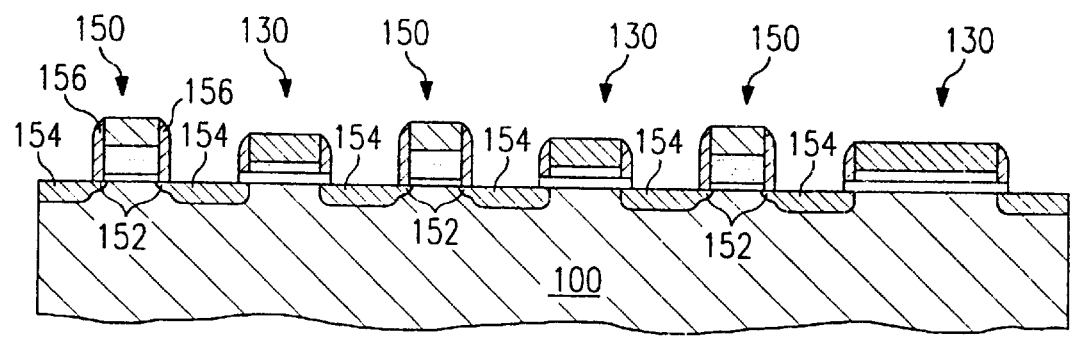
FIG. 9 shows the layers of FIG. 8 with the addition of oxide side spacers and implanted drain and source regions.

The bird's beak 106 is unnecessary to the isolating function of the field oxide 102 and disadvantageously consumes what would otherwise be active area of the substrate 100 usable for circuit component construction. In current art integrated circuit construction, each bird's beak 106 can extend, in some designs, in excess of 2500 angstroms into what would otherwise be usable active area. Additionally, the doped channel-stop regions 104 diffuse into the active areas and in some designs may cause a narrow channel effect, raising the threshold voltage of transistors constructed in the active areas. The bird's beak feature 106 of the field oxide 102, as well as the narrow channel effect produced by the channel-stop region 104, limits both the minimum dimensions separating active areas 108 and the minimum size of those active areas, thus causing difficulties in increasing the integration density. As seen in FIG. 9, and as discussed in detail below, practice of the present invention accomplishes the desired isolation with a minimum spacing between active areas of the substrate 100.

Figure 2:
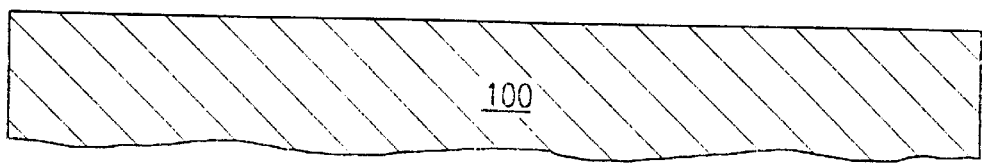
FIG. 2 shows a cross-sectional view of a portion of P-type substrate upon which an integrated circuit structure according to the present invention is to be formed.

FIGS. 2–9 illustrate the main steps carried out in practicing the present invention and the structure of the present invention. FIG. 2 shows a semiconductor substrate 100 which, in accordance with the present invention, is preferably doped either N-type or P-type. The substrate 100 could be substrate itself or, alternatively, an N-well or P-well used in connection with a CMOS process, a doped epitaxial layer, or other substrate structure. In one embodiment, the substrate 100 is doped with Boron in approximate concentration of $10^{16}$–$10^{17}$/cm3. Additional processing steps such as threshold adjustment implants, epitaxial growth, well formation and the like may be carried out as desired for each design. While the main steps according to the present invention are shown and described herein, every single step in the entire process need not be shown because such are part of the standard processing steps commonly used and known in the art.

Figure 3:
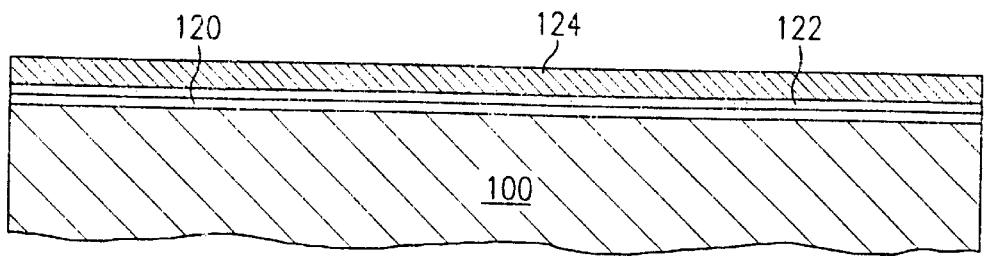
FIG. 3 is a view of layers grown and deposited according to the present invention on the surface of the substrate of FIG. 2.

Referring to FIG. 3, a first gate insulator layer or oxide 120 is grown over the entire substrate 100, followed by a deposited first polycrystalline silicon layer 122 and a deposited covering oxide layer 124. In the preferred embodiment, the first gate oxide layer 120 is somewhat thicker than a gate oxide layer used for an active transistor on the same chip. For example, the first gate oxide layer 120 may be approximately 500 angstroms thick if the standard gate oxide layer thickness is in the range of 90–200 angstroms. This ensures a slightly higher threshold voltage for the isolation gate structure 130 to be formed (see FIG. 4). In the preferred embodiment, the polysilicon layer 122 is in the range of 500 angstroms thick, but could be somewhat more or less as desired. The deposited oxide layer 124 is approximately 2000 angstroms thick. In the embodiment with a P-type substrate 100, the first polycrystalline layer is preferably doped with a P-type impurity such as Boron and in concentration roughly two to five times that of the substrate. The doping concentration of the first polysilicon layer 122 is selected to provide adequate conductivity but not be so high that Boron atoms migrate into the substrate 100 in sufficient quantity to affect the conductivity of the substrate. The slightly thicker oxide 120 also helps prevent this migration.

In the preferred embodiment, the polysilicon 122 is doped with the same conductivity type as the substrate. This provides the advantage that direct ohmic contact via a buried contact to the substrate is possible. This also reduces the risk of problems if there is a pin-hole in the oxide with some slight migration of ions. Thus, on an N-type substrate, the first polysilicon layer is doped N-type. The oxide layer may be made thinner or thicker, depending on the dopant ions used and the concentrations thereof, since some ions have a lesser tendency to migrate than others.

Figure 4:
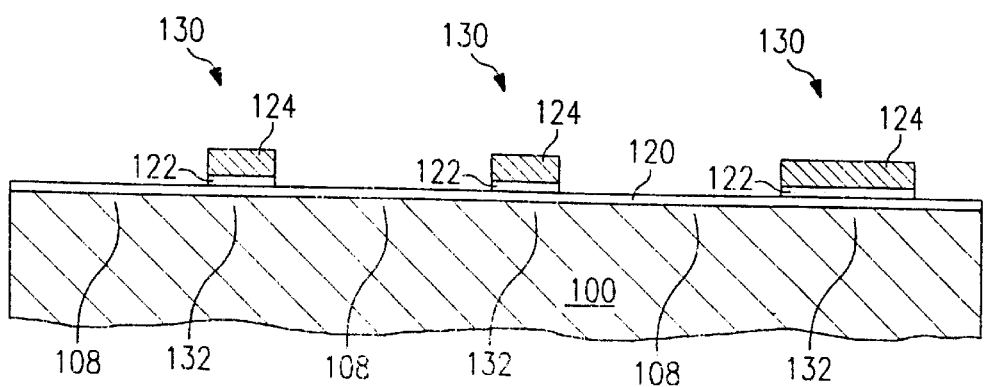
FIG. 4 shows a selective etching of the layers of FIG. 3.
Figure 5:
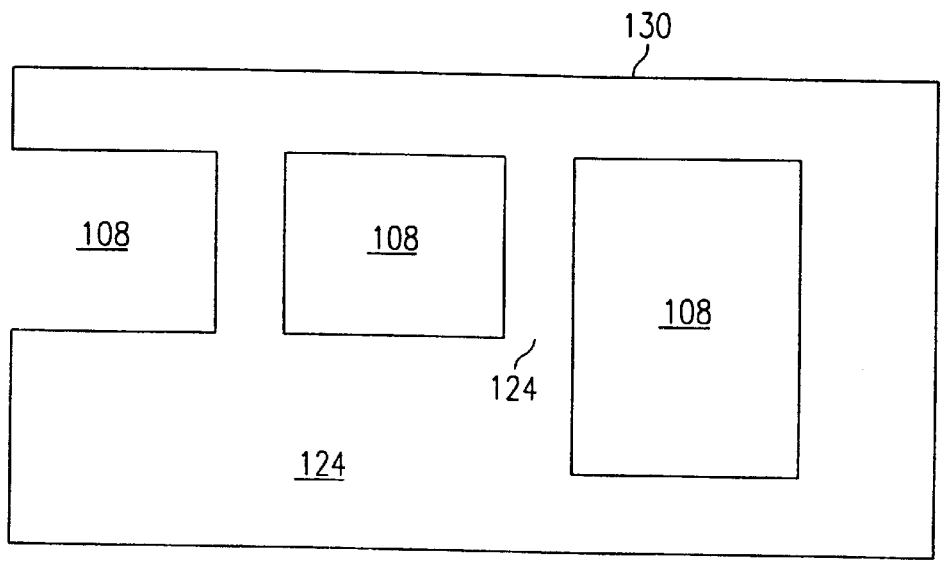
FIG. 5 is a top view of the selectively etched layers of FIG. 4, showing one possible embodiment of a circuit structure.
Figure 6:
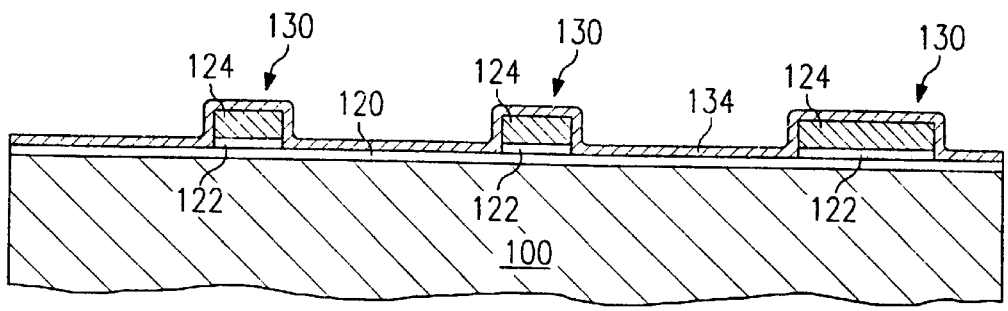
FIG. 6 shows an oxide layer deposited on top of the selectively etched layers of FIG. 4.

Referring to FIGS. 4 and 5, the surface of the chip is patterned and etched to form an isolation gate structure 130. As best seen in FIG. 5, one possible circuit configuration has the isolation gate structure 130 surrounding each of active regions 108 in which transistor structures will be formed by subsequent processing steps. In the case of a P-type substrate 100, the first polycrystalline layer 122 is preferably electrically connected to the lowest voltage supplied to the chip, typically ground potential, to ensure that the region 132 under the isolation gate 130 never conducts, thereby electrically isolating regions 108 from one another. Most often, the substrate 100 will also be connected to this lowest voltage, and in such structures it is advantageous to provide regular and direct contact between the first polycrystalline layer 122 and the substrate, by metallization layers and/or buried contacts, not shown because such are well known in the art, and any suitable ohmic layer contact to the substrate is acceptable.

The comparable doping of the substrate 100 and the first polycrystalline layer 122 provides for an ohmic connection at the buried contacts, and renders harmless any diffusion effects arising from pin-hole defects in the oxide layer 120.

A further advantage is that the grounded isolation gate structure 130 will shield against any field threshold shifts arising from mobile ions. It will be appreciated that the greatest advantage of the present invention is achieving the function of isolation with minimal dimension requirements. The isolation structure 130 of the present invention requires only the current art minimum dimensions for forming a gate structure as opposed to the in excess of three times larger minimum dimensions required for current art isolation field oxide growth.

The first gate oxide layer 120 is preferably somewhat thicker than an oxide layer for an operating transistor of the same circuit, resulting in a relatively higher magnitude threshold voltage to turn on the "channel" region 132 under the isolation gate 130. Indeed, turning on the "channel" region 132 is neither anticipated nor desired. In the case of a P-type substrate 100, the grounding of the first polycrystalline silicon layer 122 to the lowest voltage on the chip and the thick gate oxide 120 are design features tailoring the gate 130 for isolation purposes and keeping this "channel" region 132 turned off to perform the isolation. The same conductivity type doping permits easy grounding of the polysilicon 122 to the substrate 100 if desired. Of course, the isolation method and structure of the invention are applicable to a thin gate oxide 120 if design permits, the object being to prevent deleterious migration of dopant between the poly layer 122 and the substrate 100 and to keep the "channel" 132 off at all times.

Figure 7:
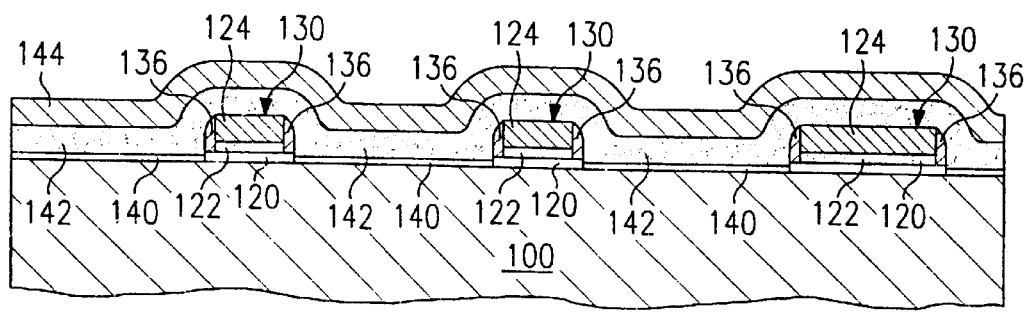
FIG. 7 shows a selective etching of the layers of FIG. 6 and subsequently grown and deposited layers.

In the next process step, an oxide ("LTO") layer 134 is formed over the entire chip (see FIG. 6) by any acceptable technique, by growth or preferably using a chemical vapor deposition ("CVD") process. Referring to FIG. 7, the oxide layer 134 is then etched using an anisotropic plasma etch, resulting in sidewall spacers 136 alongside the isolation gate structure 130. Both the sidewall spacers 136 and the covering oxide layer 124 guard against the short circuiting of the isolation gate structure 130 with other constructed circuit components. The covering oxide layer 124 also guards against contamination of the doped first polycrystalline silicon layer 122 by subsequent ion implantation procedures.

The exposed portion of the first gate oxide layer 120 is removed and a second gate oxide 140, with preferable thickness in the range of approximately 90–120 angstroms, is grown in its place. A second polycrystalline silicon layer 142, of approximately 1500 angstroms thickness, is then deposited over the surface of the chip, and subsequently a titanium silicide or other metal silicide layer 144, also of approximately 1500 angstroms thickness, is deposited. In the case of a P-type substrate 100, the covering oxide layer 124 prevents the Boron dopant in the first polycrystalline silicon layer 122 from migrating into the second polycrystalline silicon layer 142 which is itself negatively doped for lower resistivity.

Figure 8:
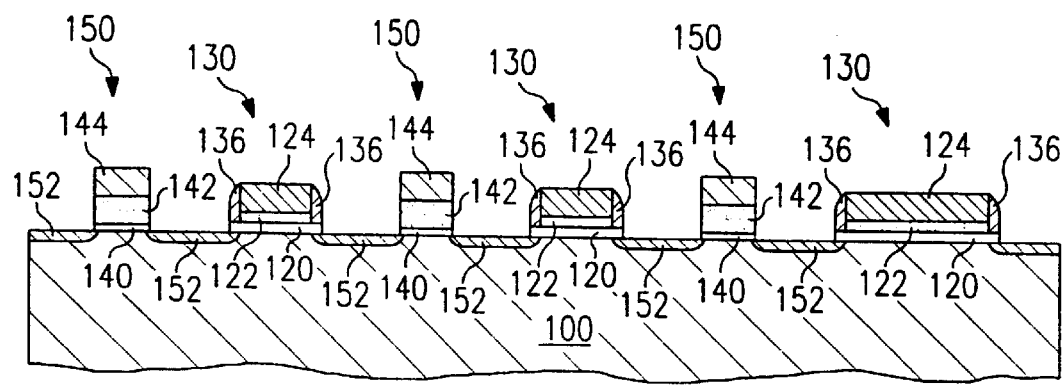
FIG. 8 shows a selective etching of the layers of FIG. 7 and a subsequent N-type implant preparatory to configuration of lightly doped drain and source structures.

Referring to FIG. 8, the surface of the chip is patterned and etched to form gate structures 150. Implants are made to form lightly doped drain ("LDD") and source extensions 152. After LDD implant and anneal, and as seen in FIG. 9, sidewall spacers 156 are formed on the gate structures 150 by anisotropic etch of a CVD oxide layer. Heavily doped drain and source regions 154 are then formed by ion implantation and anneal as is well known in the art. Subsequent processing and finishing steps are well known to the art, such as a further CVD layers with contact holes for metallization overlays and a finishing overglass layer, and are neither further described nor depicted in the figures.

Figure 11:
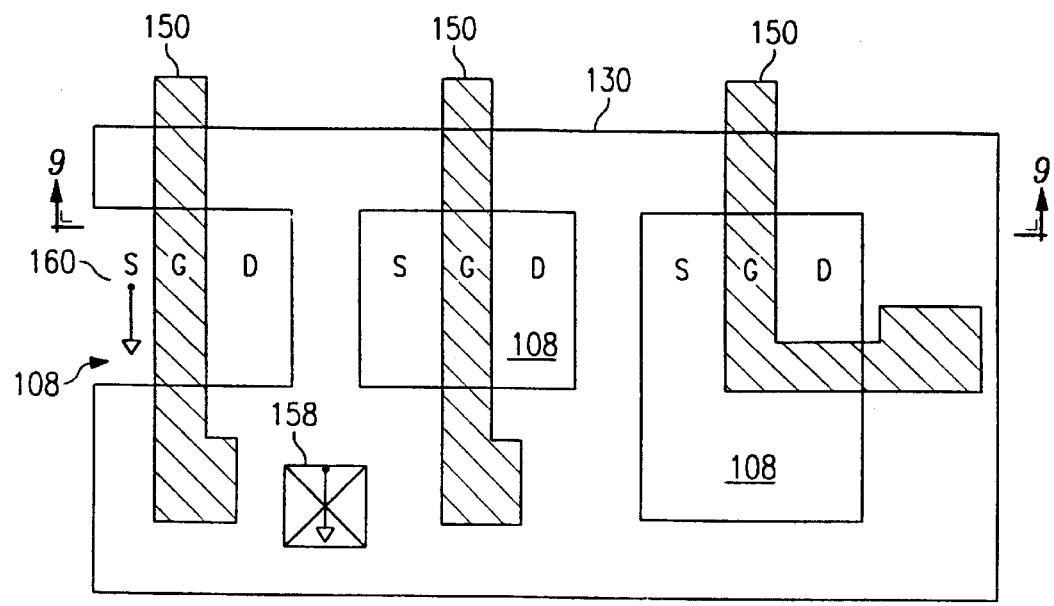
FIG. 11 is a top view of FIG. 9, showing one possible embodiment of a circuit structure, and showing electrical connections to ground potential schematically.

FIG. 11 is a top view of FIG. 9, showing one possible embodiment of a circuit structure incorporating the present invention, and indicates the gate, source and drain portions of the active regions 108 surrounded and separated by the isolation gate structure 130. A connection of the isolation gate 130 to ground, by buried contact to the P-type substrate 100, is shown schematically at 158. Buried contacts between the first poly layer 122 and the substrate 100 are formed at regular intervals and with proper spacing to ensure good ohmic electrical contact between the first polysilicon and the substrate, and to ensure the equipotential nature of the first poly and substrate. Of course, this type of structure is repeated throughout the chip and only a portion of the chip is shown. Active areas 108 will be formed above and below those shown in FIG. 11, and all the active areas are isolated by the gate isolation structure 130 in those places where field oxide was previously used.

Figure 12:
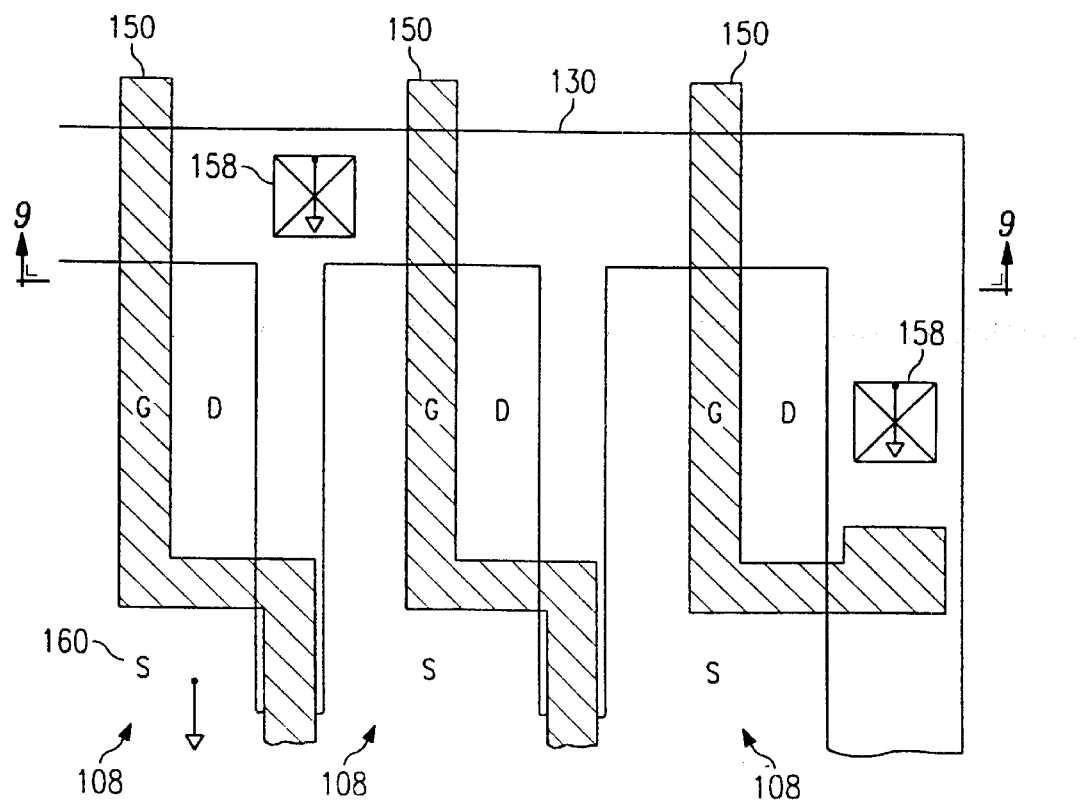
FIG. 12 is a top view showing a second possible embodiment of a circuit structure.

FIG. 12 is a top view showing a second possible embodiment of a circuit configuration where the isolation gate structure 130 is formed between, but does not surround, active areas 108. Indeed, as is common in the art, two such adjacent active areas 108 may be contiguous at, for example, a common source region (not shown). The isolation gate structure 130 isolates these active areas 108, just as current art field oxide does in such circuit designs, but advantageously allows the active regions 108 to be spaced more closely.

Figure 10:
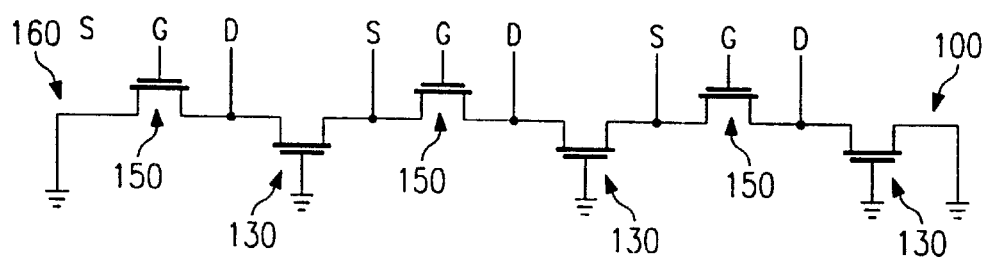
FIG. 10 is an electrical schematic diagram of the structure of FIG. 9, showing electrical connections to ground potential.

FIG. 10 is a schematic diagram of the structure of FIG. 9, showing electrical connections to ground potential of a source 160, the substrate 100 and the isolation gate structure 130. Many circuits have the source and substrate connected to the same low voltage potential, usually ground. Both the substrate 100 and isolation gate structure 130 are tied to the same voltage potential as the grounded source 160. Should it be desirable, the grounded source 160 can also be electrically connected to the substrate 100 via metal or metal silicide local interconnects as is common in the art. Further, the isolation gate structure 130 can be electrically connected to the grounded source 160 by metal or metal silicide local interconnects as desired. If a contact is made between the isolation gate 130 and the source 160, a metal contact of some type is preferred to ensure a PN junction is not formed because the source 160 and the poly of the isolation structure 130 would usually be of opposite conductivity types.

It will be appreciated that, while an illustrative embodiment of the invention has been described for purposes of illustration, modifications may be made without departing from the spirit and scope of the invention. For example, the order of process operations could be changed so as to construct the isolation gate structure from the second poly layer after the circuit component gates have been formed. The specific details for the construction of an isolation gate structure over a P-type substrate for isolating N-channel field-effect enhancement mode transistors has been described above. However, it will be appreciated by those skilled in the art that the present invention can be applied to a wide range of MOS integrated circuit structures to replace the field oxide isolation structure. As one example, a reversal of conductivity types allows a similar isolation gate structure to be formed in an N-type substrate. In this embodiment, the poly silicon 122 is doped N-type and is tied to the highest voltage potential on the chip, usually the N well, to ensure that the region of the substrate underlying the isolation gate structure never conducts and always isolates the active areas in the N-type substrate from each other.

The invention may also be used on the same chip in combination with field oxide isolation. For example, the isolation gate structure may be used within a memory array where space is precious, and standard field oxide isolation can be used in the peripheral circuits, as desired.

The invention may also be used, either alone or in combination, with a thick field isolation structure to reduce leakage currents in a semiconductor memory cell array. The technique is described herein with respect to embodiments of radiation hardened static random access memory ("SRAM") cells. Data storage nodes of a memory device are isolated from one another using an active gate isolation structure. The resulting isolation between the data storage nodes is formed from by biasing the active gate to an appropriate voltage potential to prevent a conductive channel from forming under the active gate isolation structure. Embodiments of the memory cell structure described herein may be used in a variety of memory applications, such as embedded memories, as well as discrete memory devices, and the like.

Figure 13:
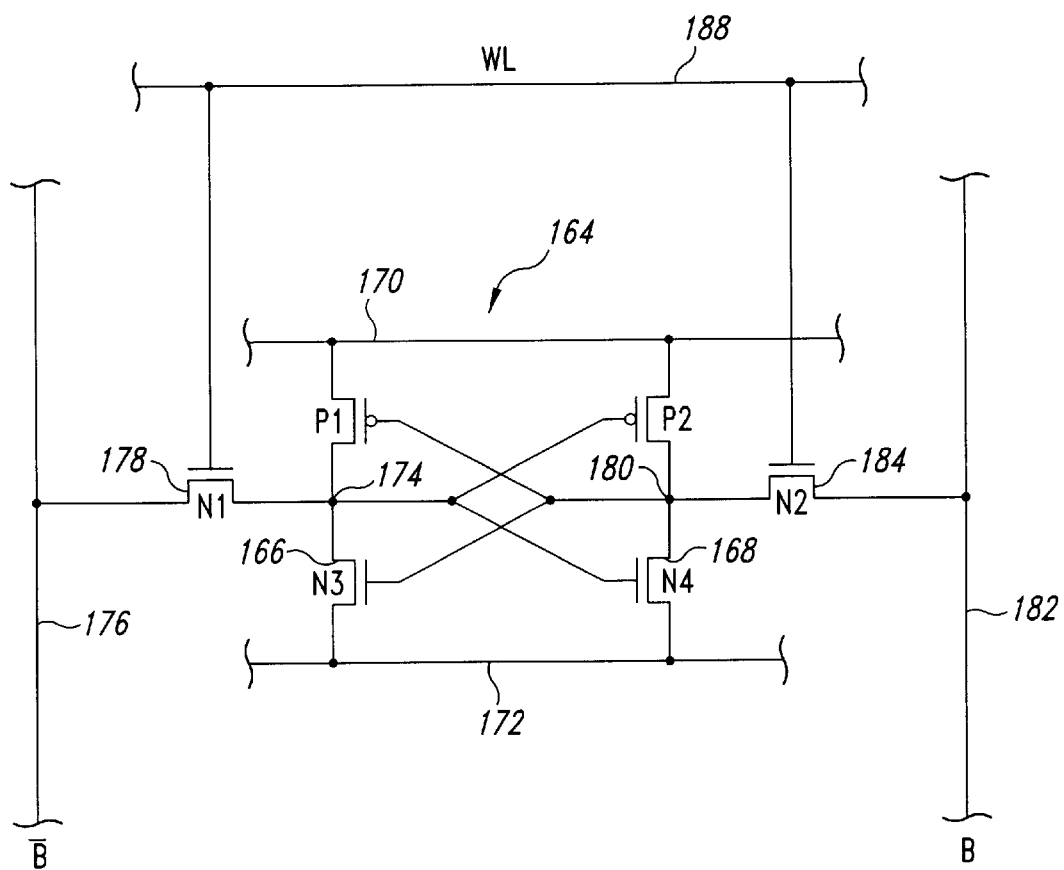
FIG. 13 illustrates a schematic diagram of a conventional SRAM memory cell.

Further illustrated in FIG. 13 are first and second pull-down transistors N3, N4 coupled between the second voltage terminal 172 on the second supply line providing a second voltage and the complementary and non-complementary data storage nodes 174, 180, respectively, each pull-down transistor N3, N4 having a gate; and first and second pull up transistors P1, P2 coupled between the first voltage terminal 170 providing a first voltage and the complementary and non-complementary data storage nodes 176, 182, respectively, each pull-up transistor P1, P2 having a gate, wherein the gates of the first pull-up and pull-down transistors P1, N3 are coupled to the non-complementary data storage node 180, and the gates of the second pull-up and pull-down transistors P2, N4 are coupled to the complementary data storage node 174. The pull-up transistors P1, P2 are PMOS transistors formed in an n-type region and the pull-down transistors N3, N4 are NMOS transistors formed in a p-type region. The first voltage is ground and the second voltage is a power supply voltage.

The first and second pull-up transistors P1, P2, each have a source region coupled to the first voltage and further have a drain region and a gate; the first and second pull-down transistors N3, N4, each have a source region coupled to the second voltage and further have a drain region and a gate, the drain regions of the first pull-up transistor P1 and pull-down transistor N3 are coupled to the gates of the second pull-up transistor P2 and pull-down transistor N4, the drain regions of the second pull-up transistor P2 and pull-down transistor N4 are coupled to the gates of the first pull-up transistor P1 and pull-down transistor N3; and the first and second transfer transistors 178, 184 are coupled between the drain regions of the first and second pull-down transistors P1, P2 and first and second sense nodes 176, 182, all respectively, each transfer transistor 178, 184 has a transfer gate disposed between the respective drain region and sense node. The pull-up transistors P1, P2 are formed over a first region of a first doping type, and the pull-down transistors N3, N4 are formed over a second region of a second doping type. The first doping type being n-type and the second doping type being p-type.

Figure 14:
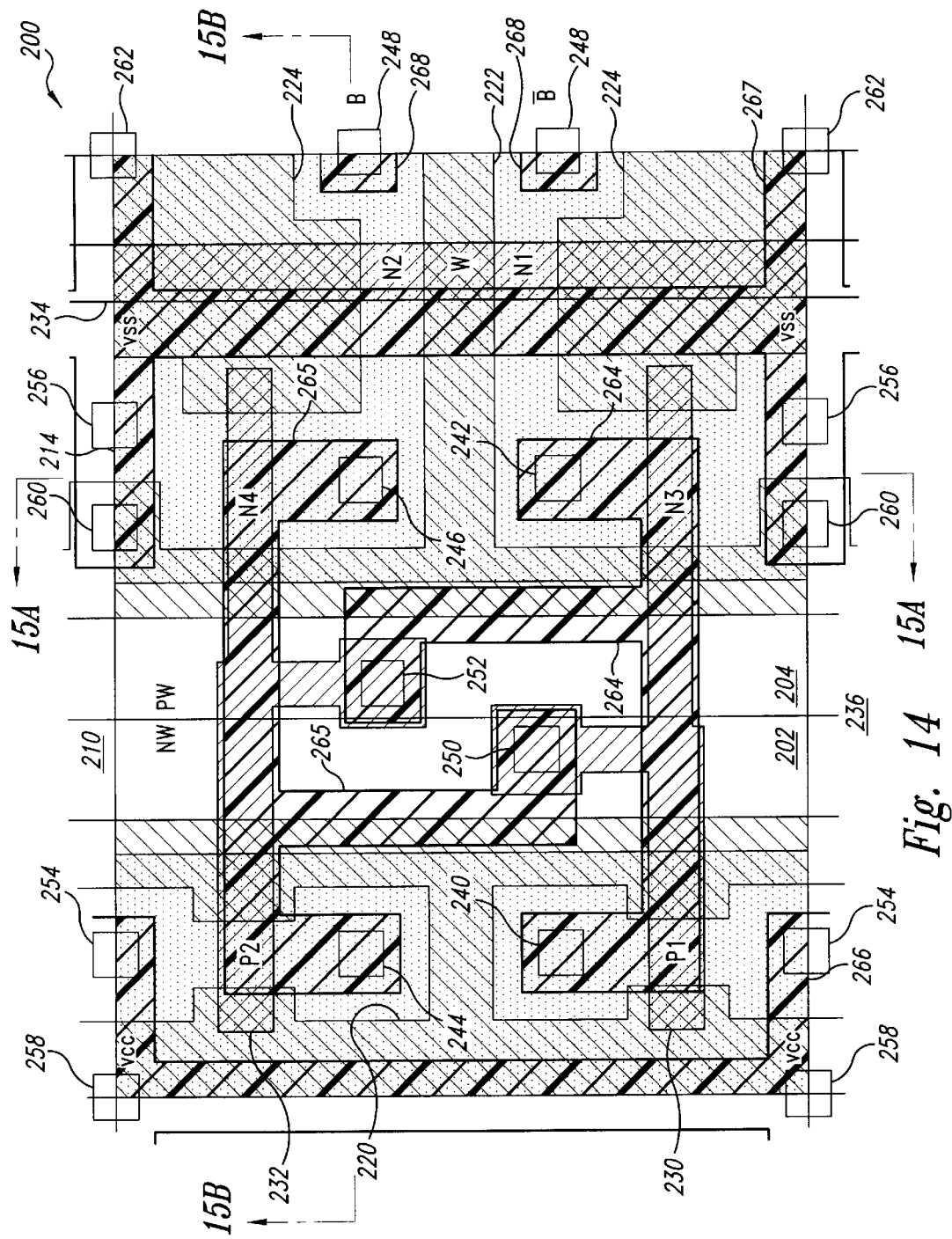
FIG. 14 illustrates a plan view of an SRAM memory cell according to an embodiment of the present invention.

Illustrated in FIG. 14 is a planar layout of an SRAM memory cell 200 in accordance with an embodiment of the present invention. As is conventional in the field of integrated circuit representation, the lateral sizes and thicknesses of the various layers are not drawn to scale and these various layers or layer portions are arbitrarily enlarged to improve drawing legibility.

An n-well region 202 and p-well region 204 are provided on a substrate 206. A thick oxide isolation region 210 is formed on the substrate 206. In the areas where the thick oxide isolation region 210 has not been formed on the substrate, an active n+ region 214 is implanted into the p-well 204 and an active p+ region 216 is implanted into the n-well 202. A gate oxide layer, a first polysilicon layer, and a covering oxide layer are deposited over the substrate and etched to form the active gate isolation regions 220, 222, and 224. Sidewall spacers are then formed on the sides of the active gate isolation regions 220, 222, and 224 to insulate the gate from subsequently deposited conductive layers. A more detailed description of the fabrication and use of the active gate isolation regions 220, 222, and 224 was previously discussed, and as such, a detailed explanation of the process has been omitted in the interests of brevity.

After sidewall formation of the active gate isolation regions 220, 222, and 224, a gate oxide layer and a second polysilicon layer are deposited over the existing structure and etched to form the gates of the transistors of the inverters 166 and 168, and the transfer gates 178 and 184. A polysilicon gate 230 corresponds to the gates of the PMOS and NMOS transistors of the inverter 166, while a polysilicon gate 232 corresponds to the gates of the PMOS and NMOS transistors of the inverter 168. A polysilicon gate 234 corresponds to the word line 188 that activates the transfer gates 178 and 184.

Contacts 240–248 and vias 250–252 are formed through a dielectric layer 253 (FIGS. 15A–B) deposited subsequent to the polysilicon gate formation. Contacts 254–256 vias 258–262 are also formed through the dielectric layer. A metal layer is formed over the dielectric layer and etched to form interconnects 264–268. The interconnect 264 couples together the drains of the PMOS transistor (through contact 240) and NMOS transistor (through contact 242) of the inverter 166 with the gates of the inverter 168 (through via 252). Similarly, the interconnect 265 couples together the drains of the PMOS transistor (through contact 244) and the NMOS transistor (through contact 246) of the inverter 168 with the gates of the inverter 166 (through via 252). With respect to FIG. 13, the data storage nodes 174 and 180 are represented by the drain regions coupled through the contacts 242 and 246, respectively. The respective data storage nodes are selectively coupled to a respective sense node 248 by the NMOS transfer gates represented by the polysilicon gate 234. The interconnect 266, which represents the VCC supply terminal 170 (FIG. 13), provides the VCC voltage to the sources of the PMOS transistors of the inverters 166 and 168 (through contacts 254), as well as to the active gate isolation region 220 (through via 258). Interconnect 267, which represents the VSS terminal 172 (FIG. 13), is provided to ground the sources of the NMOS transistors of the inverters 166 and 168 (through contacts 256), as well as the active gate isolation regions 222 and 224 (through vias 260 and 262, respectively). Metal regions 268 (through contacts 248) are provided for a subsequent metal layer that will form the bit lines 176 and 182.

Figure 15A:
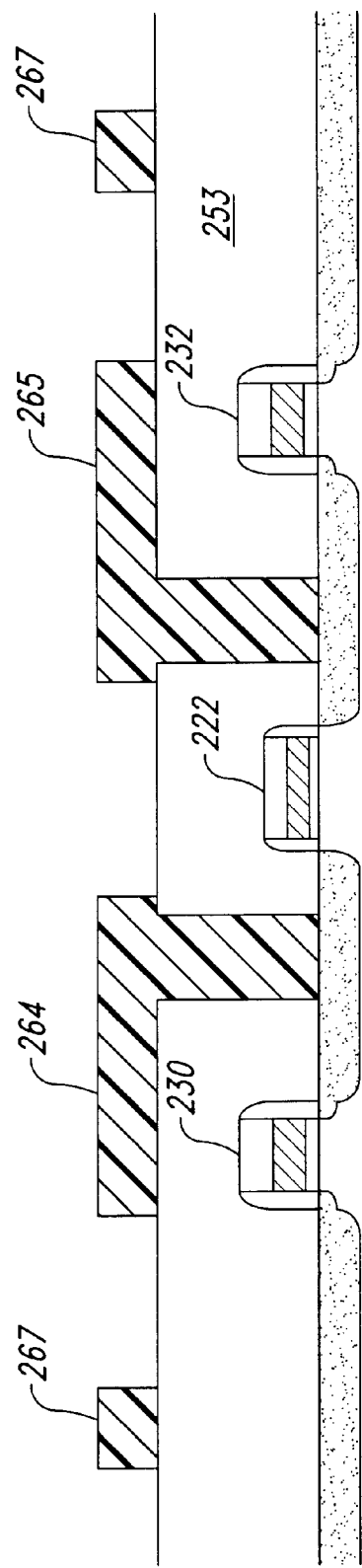
FIGS. 15A–B illustrate cross-sectional views of the SRAM memory cell shown in FIG. 14.
Figure 15B:
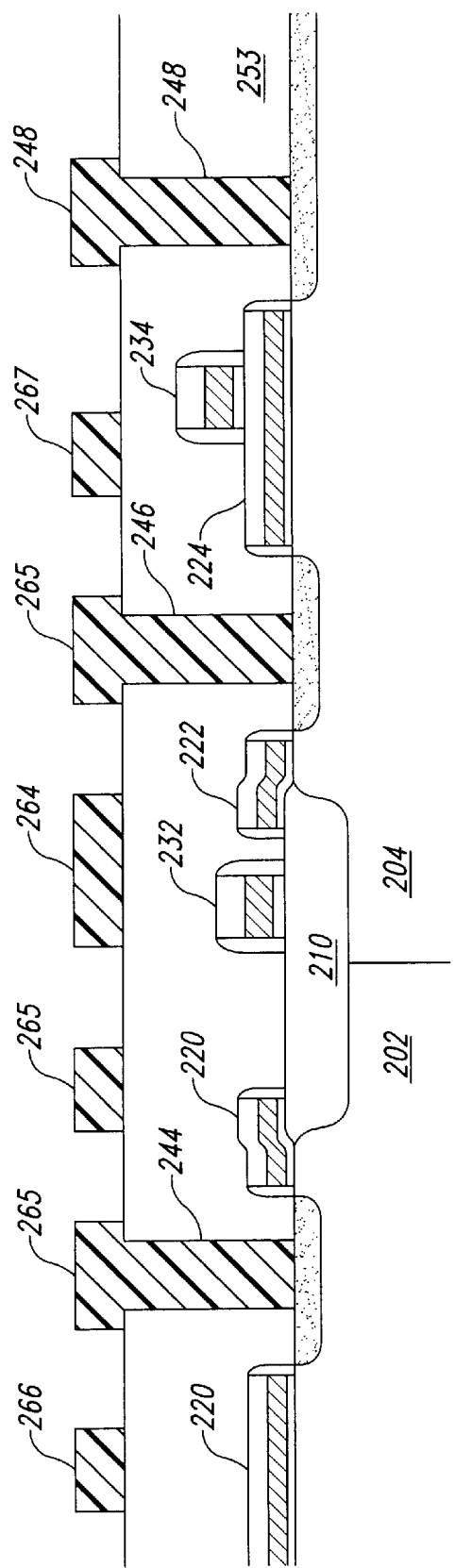

As previously described, the SRAM memory cell 200 of FIG. 14 uses the first polysilicon layer to form the active gate isolation structures 220, 222, and 224, and the second polysilicon layer to form the gates 230, 232, and 234, of the various MOS transistors. FIGS. 15A–B are cross-sectional diagrams of the SRAM cell 164. FIG. 15A illustrates a cross-section parallel to the polysilicon gate 234 and through the data storage nodes 174 and 180 (FIG. 13), represented by contacts 242 and 246. FIG. 15B illustrates a cross-section perpendicular to the polysilicon gate 234 and through the drain of a PMOS transistor, a data storage node, and a sense node, represented by the contacts 244, 246, and 248, respectively. As shown in FIGS. 15A–B, the active gate isolation region 220 is provided to prevent current leakage between the drains of the PMOS transistors of the inverters 166 and 168 (contacts 240 and 244), and leakage across the thick oxide isolation region 210 to the data storage nodes (contacts 242 and 246). Similarly, the active gate isolation region 222 is provided to prevent current leakage across the thick oxide isolation region 210, and between the data storage nodes 174 and 180 (contacts 242 and 246). The active gate isolation regions 224 are provided to prevent current leakage between the sense nodes coupled to bit lines 176 and 182 (contacts 248) and the respective data storage node (contacts 242 and 246). Active gate isolation regions 224 further prevent leakage between the VSS supply terminal 172 (contacts 256) and the sense nodes (contacts 248) and the data storage nodes (contacts 242 and 246).

The resulting conduction channels of the respective MOS transistors of the SRAM cell 200 have widths defined by the position of the active gate isolation structures 220, 222, and 224 of the first polysilicon layer, and lengths defined by the gates 230, 232, and 234 of the second polysilicon layer, which extend perpendicularly across the width of the conduction channels. Leakage currents are reduced by isolating physically adjacent nodes (e.g., 240 and 244, 242 and 246, contacts 248) using the active gate isolation structures 220, 222, and 224. The active gate isolations structures 220, 222, and 224 are biased to an appropriate voltage in order to ensure a conduction channel does not form under the respective gate regions. Typically, the appropriate voltage is the body region potential in which the respective transistor is formed. For example, for the active gate isolation region 220, which isolates the drain nodes of the PMOS transistors of the inverters 166 and 168 that are formed in the n-type region 202, the appropriate potential is VCC. However, the active gate isolation regions 222 and 224, which isolate the drain nodes of the NMOS transistors of the inverters 166 and 168 formed in the p-type region 204, as well as the sense nodes, are coupled to VSS.

It will be appreciated that various methods for connecting the polysilicon gate of the active gate isolation structures 220, 222, and 224 to the appropriate voltage potential are well known in the art. For example, in the present example, interconnect 267 provides a VSS voltage to the active gate isolation structures 222 and 224 through the vias 260 and 262, respectively. A VCC voltage is provided to the active gate isolation structure 220 by interconnect 266 through vias 258. However, in the case where the well region over which the active gate isolation structure is formed has been biased with the appropriate voltage, the gate isolation structures may also be appropriately biased by directly coupling the gate to the respective well region using metallization layers and/or buried contacts. Thus, the specific form of the connection should not limit the scope of the present invention.

As will also be appreciated, the main steps according to the present invention are shown and described herein, however, some steps in the process have not been shown because such standard processing steps are commonly used. Additional processing steps such as threshold adjustment implants, epitaxial growth, well formation, and the like, may be carried out as desired. For example, the polysilicon gates are illustrated in FIGS. 15A–B as having oxide sidewall formations and the active n+ regions 214 as having a profile where additional implant steps were made following the formation of the polysilicon gate layer. However, these additional process steps for the formation of these structures are well known in the art.

While various embodiments have been described in this application for illustrative purposes, the claims are not limited to these embodiments. Many modifications can be made to the structures and methods shown and described herein that take advantage of the present invention. For example, some method steps can be added or substituted for the steps disclosed and claimed herein to achieve this invention.

What is claimed is:

1. A semiconductor memory, comprising:
   a plurality of memory cells formed on a substrate having a surface and arranged in a matrix, each memory cell having at least one data storage node selectively coupled to a sense node by a transfer gate disposed therebetween, the at least one data storage node electrically isolated from adjacent data storage nodes by an active gate isolation structure formed therebetween on the surface of the substrate and biased to a first voltage;
   a plurality of word lines coupling together a row of transfer gates; and
   a plurality of bit lines coupling together a column of sense nodes.

2. The semiconductor memory of claim 1, further comprising an oxide isolation structure formed in the substrate adjacent to the active gate isolation structure.

3. The semiconductor memory of claim 1, further comprising complementary and non-complementary transfer transistors, each having a transfer gate and wherein each memory cell comprises a static random access memory cell having complementary and non-complementary data storage nodes, the complementary and non-complementary data storage nodes coupled to a respective sense node through a respective transfer transistor.

4. The semiconductor memory of claim 3 wherein a gate of the active gate isolation structure is formed from a first layer of polysilicon and the transfer gates of the transfer transistors are formed from a second layer of polysilicon.

5. The semiconductor memory of claim 4 wherein the active gate isolation structure is formed on the surface of the substrate between the complementary and non-complementary data storage nodes.

6. The semiconductor memory of claim 3 wherein the static random access memory cell comprises:
   first and second pull-down transistors coupled between a second voltage terminal providing a second voltage and the complementary and non-complementary data storage nodes, respectively, each pull-down transistor having a gate; and
   first and second pull up transistors coupled between a first voltage terminal providing a first voltage and the complementary and non-complementary data storage nodes, respectively, each pull-up transistor having a gate,
   wherein the gates of the first pull-up and pull-down transistors coupled to the non-complementary data storage node, and the gates of the second pull-up and pull-down transistors coupled to the complementary data storage node.

7. The semiconductor memory of claim 6 wherein the pull-up transistors comprise PMOS transistors formed in an n-type region and the pull-down transistors comprise NMOS transistors formed in a p-type region.

8. The semiconductor memory of claim 7 wherein the active gate isolation structure comprises:
   a first active gate structure formed on the surface of the substrate between drain regions of the first and second NMOS pull-down transistors and biased to the first voltage; and
   a second active gate structure formed on the surface of the substrate between drain regions of the first and second PMOS pull-up transistors and biased to the second voltage.

9. The semiconductor memory of claim 8 wherein the first voltage is ground and the second voltage is a power supply voltage.

10. The semiconductor memory of claim 8 wherein the active gate isolation structure further comprises third active gate structures disposed between source regions of the first and second NMOS pull-down transistors and a respective sense node, the third active gate structures biased to the first voltage.

11. The semiconductor memory of claim 8 wherein the first active gate structure is coupled to a first conductive interconnection providing the first voltage and the second active gate structure is coupled to a second conductive interconnection providing the second voltage.

12. A static random access memory, comprising:
   first and second pull-up transistors, each having a source region coupled to a first voltage and further having a drain region and a gate;
   first and second pull-down transistors, each having a source region coupled to a second voltage and further having a drain region and a gate, the drain regions of the first pull-up and pull-down transistors coupled to the gates of the second pull-up and pull-down transistors, the drain regions of the second pull-up and pull-down transistors coupled to the gates of the first pull-up and pull-down transistors;
   first and second transfer transistors coupled between the drain regions of the first and second pull-down transistors and first and second sense nodes, all respectively, each transfer transistor having a transfer gate disposed between the respective drain region and sense node; and
   a first active gate isolation structure having a gate formed over the substrate between the drain regions of the pull-down transistors, the gate of the first active gate isolation structure coupled to the second voltage to maintain a non-conductive region between the drain regions of the pull-down transistors.

13. The static random access memory of claim 12 wherein the gate of the first active gate isolation structure is formed from a first polysilicon layer, and the gates of the pull-down transistors and the transfer gates are formed from a second polysilicon layer.

14. The static random access memory of claim 12 wherein the pull-up transistors are formed over a first region of a first doping type and the pull-down transistors are formed over a second region of a second doping type.

15. The static random access memory of claim 14 wherein the first doping type comprises n-type and the second doping type comprises p-type.

16. The static random access memory of claim 14, further comprising a second active gate isolation structure having a gate formed over first region between the drain regions of the pull-up transistors, the gate of the second active gate isolation structure coupled to the first voltage to maintain a non-conductive region between the drain regions of the pullup transistors.

17. The static random access memory of claim 16 wherein the first voltage comprises a power supply voltage and the second voltage is ground.

18. The static random access memory of claim 16 wherein the gate of the second active gate isolation structure is coupled to a conductive interconnect biased at the first voltage level and the gate of the first active gate isolation structure is coupled to a conductive interconnect biased at the second voltage level.

19. The static random access memory of claim 16, further comprising an oxide isolation region formed in the substrate between the first and second regions.

20. The static random access memory of claim 19 wherein the gates of the first and second active gate isolation structures are further formed adjacent to the oxide isolation region.

21. The static random access memory of claim 16, further comprising third active gate isolation structures having gates formed over second region between the source regions of the first and second pull-down transistors and the first and second sense nodes, respectively, the gate of the third active gate isolation structure coupled to the second voltage to maintain a non-conductive region between the source regions and the respective sense node.

\* \* \* \* \*